United States Patent
Maki, Jr.

(10) Patent No.: US 9,224,938 B2
(45) Date of Patent: Dec. 29, 2015

(54) PIEZOELECTRIC ELEMENT AND METHOD TO REMOVE EXTRANEOUS VIBRATION MODES

(75) Inventor: Voldi E. Maki, Jr., Austin, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 297 days.

(21) Appl. No.: 13/879,748

(22) PCT Filed: Apr. 11, 2011

(86) PCT No.: PCT/US2011/031967
§ 371 (c)(1),
(2), (4) Date: Apr. 16, 2013

(87) PCT Pub. No.: WO2012/141682
PCT Pub. Date: Oct. 18, 2012

(65) Prior Publication Data
US 2013/0200756 A1    Aug. 8, 2013

(51) Int. Cl.
*H01L 41/08* (2006.01)
*B06B 1/06* (2006.01)
*H01L 41/09* (2006.01)
*H01L 41/338* (2013.01)
*H01L 41/33* (2013.01)

(52) U.S. Cl.
CPC ............. *H01L 41/08* (2013.01); *B06B 1/0651* (2013.01); *H01L 41/0986* (2013.01); *H01L 41/33* (2013.01); *H01L 41/338* (2013.01); *Y10T 29/42* (2015.01)

(58) Field of Classification Search
USPC .......................................... 310/334, 367, 369
See application file for complete search history.

(56) References Cited

U.S. PATENT DOCUMENTS

| | | | |
|---|---|---|---|
| 2,543,500 A | 2/1951 | Kettering et al. | |
| 2,716,708 A | 8/1955 | Bradfield | |
| 3,036,231 A | 5/1962 | Henry | |
| 3,059,130 A | 10/1962 | Robins | |
| 3,086,195 A | 4/1963 | Halliday | |
| 3,114,849 A | 12/1963 | Poschenrieder | |
| 3,698,051 A * | 10/1972 | Miller | 29/25.35 |
| 4,012,952 A | 3/1977 | Dory | |
| 4,156,156 A | 5/1979 | Sweany | |

(Continued)

FOREIGN PATENT DOCUMENTS

EP    0031614 B2    7/1990
GB    2168569 A     6/1986

(Continued)

OTHER PUBLICATIONS

"Advanced Ultrasonic Downhole Transducers & Materials", Piezo Technologies, PDS 15489 Rev 1106, [online]. [archived Jan. 4, 2007]. Retrieved from the Internet: <URL:http://web.archive.org/web/20070104222426/http://www.piezotechnologies.com/pdf/Downhole.pdf>, 2 pgs.

(Continued)

*Primary Examiner* — J. San Martin
(74) *Attorney, Agent, or Firm* — Schwegman Lundberg & Woessner, P.A.; Benjamin Fite

(57) ABSTRACT

A piezoelectric element and a manufacturing method to reduce extraneous radial vibration modes is disclosed, in an example embodiment, four slots, arranged at 90 degrees, are made in one surface such that the slots do not reach the opposite surface.

22 Claims, 4 Drawing Sheets

(56) References Cited

U.S. PATENT DOCUMENTS

| | | | |
|---|---|---|---|
| 4,156,158 | A | 5/1979 | Wilson et al. |
| 4,166,230 | A | 8/1979 | Luft |
| 4,276,779 | A | 7/1981 | Davis, Jr. |
| 4,305,014 | A | 12/1981 | Borburgh et al. |
| 4,455,502 | A | 6/1984 | Nakatani |
| 4,532,615 | A | 7/1985 | Ballinger |
| 4,586,512 | A * | 5/1986 | Do-huu et al. ............ 600/447 |
| 4,692,654 | A | 9/1987 | Umemura et al. |
| 4,803,392 | A | 2/1989 | Kushida et al. |
| 4,888,861 | A | 12/1989 | Day |
| 4,890,268 | A * | 12/1989 | Smith et al. ............... 367/138 |
| 5,044,462 | A | 9/1991 | Maki, Jr. |
| 5,460,181 | A * | 10/1995 | Seyed-Bolorforosh ....... 600/447 |
| 5,465,725 | A * | 11/1995 | Seyed-Bolorforosh ....... 600/459 |
| 5,869,767 | A * | 2/1999 | Hayward et al. ............. 73/774 |
| 6,278,224 | B1 * | 8/2001 | Sawada et al. ............. 310/334 |
| 7,036,363 | B2 | 5/2006 | Yogeswaren |
| 2005/0146247 | A1 * | 7/2005 | Fisher et al. ............. 310/334 |
| 2013/0207518 | A1 * | 8/2013 | Maki, Jr. ................ 310/334 |
| 2013/0327139 | A1 * | 12/2013 | Goodman et al. ......... 73/152.58 |

FOREIGN PATENT DOCUMENTS

| | | | |
|---|---|---|---|
| JP | 57-132497 | A | 8/1982 |
| JP | 57132497 | | 8/1982 |
| JP | 59-202059 | A | 11/1984 |
| JP | 59202059 | | 11/1984 |
| JP | 11-108714 | A | 4/1999 |
| JP | 11108714 | | 4/1999 |
| WO | WO-2012141682 | A1 | 10/2012 |

OTHER PUBLICATIONS

"Internatioanl Application Serial No. PCT/US2011/031967, Written Opinion mailed Jan. 26, 2012", 5 pgs.

"International Application Serial No. PCT/US2011031967, Search Report mailed Jan. 26, 2012", 5 pgs.

Guo, H., et al., "Design and Fabrication of Broadband Graded Ultrasonic Transducers with Rectangular Kerfs", IEEE Transactions on Ultrasonics, Ferroelectrics and Frequency Control, 52(11), (Nov. 2005), 2096-2102.

Lin, R.-L., "Piezoelectric Transformer Characterization and Application of Electronic Ballast", Dissertation submitted to the Faculty of the Virginia Polytechnic Institute, (Nov. 26, 2001), 171 pgs.

"International Application Serial No. PCT/US2011/031967, International Preliminary Report on Patentability mailed Oct. 24, 2013", 7 pgs.

* cited by examiner

PIEZOELECTRIC ELEMENT AND METHOD TO REMOVE EXTRANEOUS VIBRATION MODES

RELATED APPLICATIONS

This application is an U.S. National Stage Filing under 35 U.S.C. 371 from International Application No. PCT/US2011/031967, filed on 11 Apr. 2011, and published as WO 2012/141682 A1 on 18 Oct. 2012,which application and publication are incorporated herein by reference in their entirety.

TECHNICAL FIELD

The present invention relates generally to apparatus for making measurements related to oil and gas exploration.

BACKGROUND

In drilling wells for oil and gas exploration, understanding the structure and properties of the associated geological formation provides information to aid such exploration. Measurements in a borehole are typically performed to attain this understanding. However, the pressure and temperatures accompanying measurement tools in the borehole of a well can affect operation of these tools in the borehole. The usefulness of such measurements may be related to the precision or quality of the information derived from such measurements.

DETAILED DESCRIPTION

The following detailed description refers to the accompanying drawings that show, by way of illustration and not limitation, various embodiments in which the invention may be practiced. These embodiments are described in sufficient detail to enable those skilled in the art to practice these and other embodiments. Other embodiments may be utilized, and structural, logical, and electrical changes may be made to these embodiments. The various embodiments are not necessarily mutually exclusive, as some embodiments can be combined with one or more other embodiments to form new embodiments. The following detailed description is, therefore, not to be taken in a limiting sense.

In various embodiments, a piezoelectric element can be processed such that radial modes of the piezoelectric element are reduced in operation in a transducer. Typically, for a piezoelectric element structured to operate in the thickness mode, when it contracts in the thickness, it expands to some degree in the radial direction. With the radial expansion, waves are generated in the piezoelectric element. In various embodiments, the piezoelectric element can be adjusted to reduce the operational radial vibration modes during construction for use in an acoustic transducer. The piezoelectric element can be modified to break up these radial modes of vibration such that, after an initial pulse, the piezoelectric element quietens down with respect to vibrations much more quickly than attainable using the same piezoelectric element without the modifications. Such modifications to the piezoelectric element can be realized by forming slots in the piezoelectric element. The piezoelectric element can be realized as a piezoelectric ceramic. The piezoelectric element can be arranged in a housing constructed for operation at temperatures and pressures associated with drilling operations in a borehole.

Figure 1:
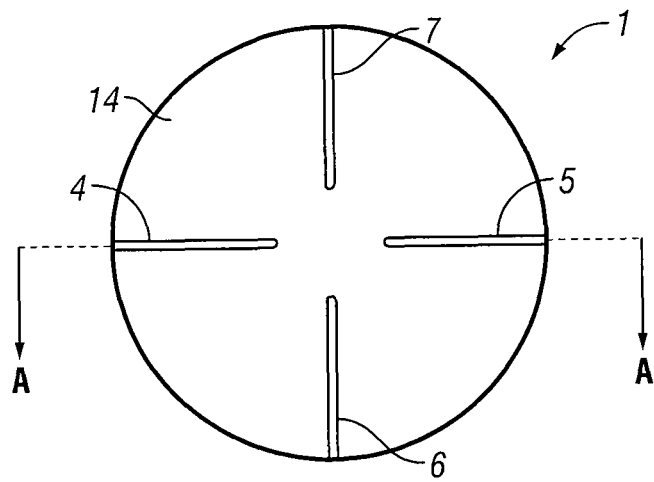
FIG. 1 shows an example of a piezoelectric element having slots to remove extraneous vibration modes, in accordance with various embodiments.

FIG. 1 shows an embodiment of an example piezoelectric element 1 having slots 4, 5, 6, and 7. Slots 4, 5, 6, and 7 can be formed in piezoelectric element 1 such that each slot begins on one surface 14 of piezoelectric element 1, progresses through piezoelectric element 1, and terminates before reaching the surface of piezoelectric element 1 opposite to surface 14 on which the slot begins. Slots 4, 5, 6, and 7 can be arranged on the backside of piezoelectric element 1. In addition, slots 4, 5, 6, and 7 can be arranged on the backside 14 such that there is no electrical discontinuity allowing use of a single wire connection to backside 14. The backside is opposite the surface used as the sensing element, where the backside is the surface to which a backing material can be contacted.

Backside 14 can be bonded to a backing material such that a wire connection can be made to backside 14. A notch can be made in the backing material with a wire electrode soldered or glued with a conductive epoxy to the backside 14 of the piezoelectric element 1. Other mechanisms for electrically contacting backside 14 can be implemented. The backing material can be used to arrange piezoelectric element 1 in an appropriate housing. Such a housing may be selected for operation at temperatures and pressures associated with drilling operations in a borehole.

Slots 4, 5, 6, and 7 can be formed in piezoelectric element 1 as cuts in piezoelectric element 1. These cuts can be implemented such that each cut 4, 5, 6, and 7 can be arranged at 90° from an adjacent one of the cuts 4, 5, 6, and 7 on surface 14 relative to the periphery of piezoelectric element 1. Slots 4, 5, 6, and 7 can be made by cutting at 180 degrees aligned to be directed through the center of piezoelectric element 1, but with the cut terminated prior to reaching the center of piezoelectric element 1. Alternatively, cuts 4, 5, 6, and 7 may be made at other angles. Additionally, the number of cuts in piezoelectric element 1 can include more or less than four cuts. Cuts 4, 5, 6, and 7 in piezoelectric element 1 may be made using various techniques for cutting the selected material for piezoelectric element 1. For a ceramic piezoelectric element 1, cuts can be made in the back-side of the ceramic piezoelectric element 1 using a diamond saw. Other cutting tools and/or material removal methods can be used.

The cuts can be made in various directions into piezoelectric element 1 with appropriate depth and width to reduce the effect of modes of vibration that are not the preferred thickness mode of piezoelectric element 1. For example, making deep cuts approximately 0.02 inches wide in various directions into a ceramic piezoelectric element can reduce the effect of modes of vibration that are not the preferred thickness mode. The deep cuts can be made such that the cuts are about 80% through the ceramic at 90° in the back-side of the ceramic, which can significantly reduce the unwanted modes. The cuts can be made to different percentages of the thickness of piezoelectric element 1. The cuts can be made such that surface 14 of piezoelectric element 1 continues to maintain a single continuous electrode surface so that only one wire can be used to make electrical contact to the surface. The cuts can be made before an electrode is applied to surface 14 of piezoelectric element 1 or after the electrode is applied to surface 14.

Figure 2:
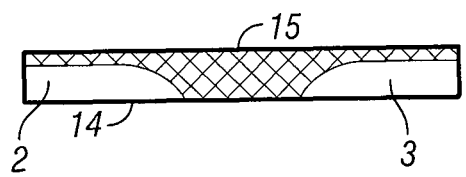
FIG. 2 shows a cross section of the piezoelectric element of FIG. 1, in accordance with various embodiments.

FIG. 2 shows a cross section of piezoelectric element 1 of FIG. 1. Piezoelectric element 1 has a surface 15 arranged as a sensing element and surface 14 attachable to a backing. Surface 15 can provide a front side of piezoelectric element 1 for an electrode surface on piezoelectric element 1, where the electrode surface on surface 15 can be configured as rings for a focused transducer. FIG. 2 demonstrates that cuts in piezoelectric element 1 from back side 14 do not extend completely to surface 15, but can be made to a sufficient depth such that the portion of piezoelectric element 1 at which the cut terminates has a thickness that can be a small fraction of the thickness of piezoelectric element 1 in portions of piezoelectric element 1 that do not include cuts. Individual cuts with cross sections 2 and 3 do not connect to each other such that surface 14 of piezoelectric element 1 can continue to maintain a single continuous electrode surface so that only one wire can be used to make electrical contact to the surface.

Each of surfaces 14 and 15 of piezoelectric element 1 can be structured as flat surfaces on which electrodes can be attached. Operationally, when a voltage is applied between the electrodes on surfaces 14 and 15, the applied voltage causes piezoelectric element 1 to expand and contract as a function of the voltage. By not making the cuts all the way through piezoelectric element 1, the voltage can be applied to only one wire attachment on surface 14 and only one wire attachment on surface 15, which can streamline the construction process for the associated transducer. In various embodiments, while surface 14 has wire connection, surface 15 may have multiple wire connections.

Figure 3:
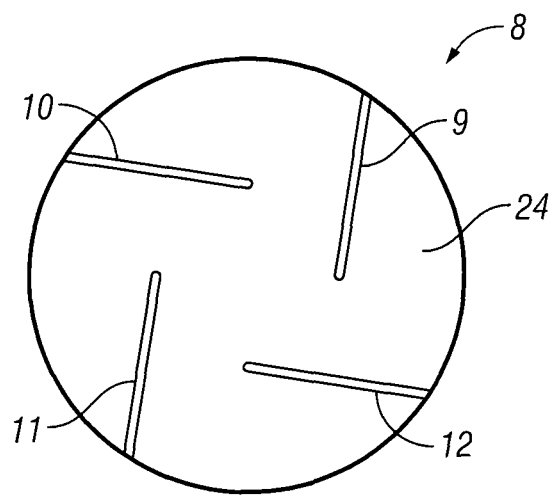
FIG. 3 shows another example of a piezoelectric element having slots to remove extraneous vibration modes, in accordance with various embodiments.

FIG. 3 shows an embodiment of an example piezoelectric element 8 having slots 9, 10, 11, and 12 arranged in a different configuration with respect to slots 4, 5, 6, and 7 of piezoelectric element 1 of FIG. 1. Slots 9, 10, 11, and 12 can be formed in piezoelectric element 8 such that each slot begins on one surface 24 of piezoelectric element 8, progresses through piezoelectric element 8, and terminates before reaching the surface of piezoelectric element 8 opposite to surface 24 on which the slot begins. Slots 9, 10, 11, and 12 can be arranged on the backside of piezoelectric element 8. In addition, slots 9, 10, 11, and 12 can be arranged on backside 24 such that there is no electrical discontinuity allowing use of a single wire connection to backside 24.

Slots 9, 10, 11, and 12 can be formed in piezoelectric element 8 as cuts in piezoelectric element 8. These cuts can be implemented such that each cut 9, 10, 11, and 12 can be arranged with respect an adjacent one of the cuts 9, 10, 11, and 12 on surface 24 at an angle different from 90° relative to the periphery of piezoelectric element 8. Cuts 9, 10, 11, and 12 may be made at other angles than shown in FIG. 3. Additionally, the number of cuts in piezoelectric element 8 can include more or less than four cuts. Cuts 9, 10, 11, and 12 in piezoelectric element 8 may be made using various techniques for cutting the selected material for piezoelectric element 8. For a ceramic piezoelectric element 1, cuts can be made in the back-side of the ceramic piezoelectric element 8 using a diamond saw. Other cutting tools and/or material removal methods can be used.

The cuts can be made in various directions into piezoelectric element 1 with appropriate depth and width to reduce the effect of modes of vibration that are not the preferred thickness mode of piezoelectric element 8. For example, making deep cuts approximately 0.02 inches wide in various directions into a ceramic piezoelectric element can reduce the effect of modes of vibration that are not the preferred thickness mode. The deep cuts can be made such that the cuts are about 80% through the ceramic in the back-side of the ceramic, which can significantly reduce the unwanted modes. The cuts can be made to different percentages of the thickness of piezoelectric element 8. The cuts can be made such that surface 24 of piezoelectric element 8 continues to maintain a single continuous electrode surface so that only one wire can be used to make electrical contact to the surface.

Figure 4:
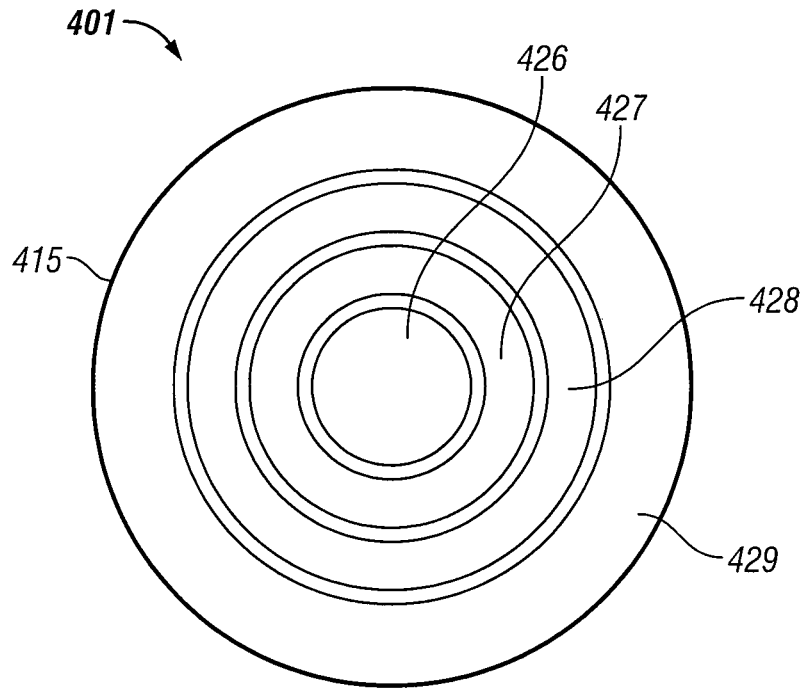
FIG. 4 shows a surface of an example piezoelectric element, in accordance with various embodiments.

FIG. 4 shows a surface 415 of an example embodiment of a piezoelectric element 401. Surface 415 is the front surface of piezoelectric element 401 coupled as a sensing part of a transducer. Surface 415, similar to surface 15 of piezoelectric element 1 FIG. 2, can be a continuous surface without slots unlike surface 14 of piezoelectric element 1 of FIG. 2. Conductive rings 426, 427, 428, and 429 can be disposed on surface 415 to provide an electrode assembly to surface 415. The individual rings may be electrically activated so as to produce a planar focused transducer.

In various embodiments, a piezoelectric element can be structured such that unwanted modes are reduced in operation of the piezoelectric element. Cutting slots in the piezoelectric element provides a method to enable adequate reduction in unwanted modes without extreme expense of composite methods of manufacture or dicing the piezoelectric element into small elements. Such methods as taught herein provide a mechanism to construct a transducer with a piezoelectric element at a lower cost and can improve acoustic properties of the piezoelectric element. The piezoelectric element can be implemented as a ceramic piezoelectric element.

Figure 5:
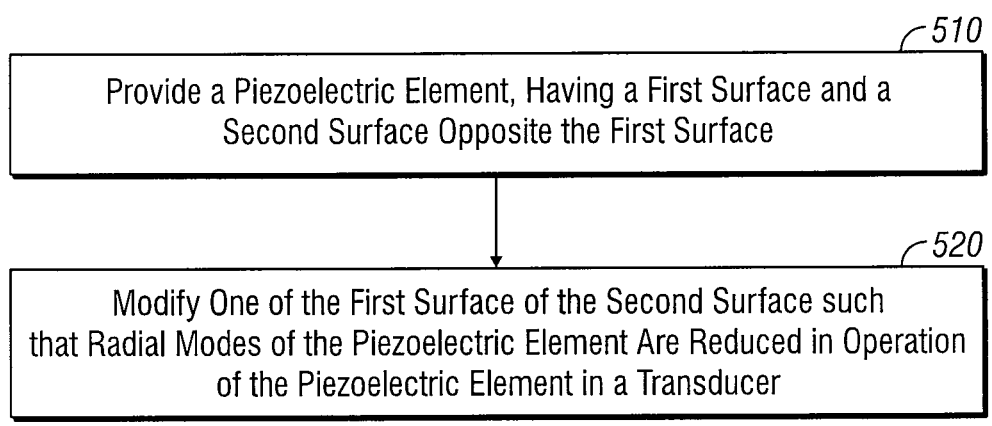
FIG. 5 shows features of an example method to remove extraneous vibration modes, in accordance with various embodiments.

FIG. 5 shows features of an embodiment of an example method to remove extraneous vibration modes. At 510, a piezoelectric element, having a first surface and a second surface opposite the first surface, is provided. One of the first surface or a second surface is a front surface to sense vibrations, while the other surface of the two surfaces is a back surface. At 520, one of the first surface or the second surface can be modified such that radial modes of the piezoelectric element are reduced in operation of the piezoelectric element in a transducer.

The first surface, being a back surface of the piezoelectric element, can be modified by forming a number of slots in the piezoelectric element from the first surface towards the second surface such that the slots do not reach the second surface. Forming the number of slots in the piezoelectric element from the first surface towards the second surface can include making four cuts in the piezoelectric element such that each cut can be arranged at 90 degrees from an adjacent one of the cuts on the first surface relative to the periphery of the piezoelectric element. Other number of cuts can be used at different angles from adjacent cuts on the first surface relative to the periphery of the piezoelectric element. Forming the number of slots in the piezoelectric element from the first surface towards the second surface can include making a first cut in the piezoelectric element and making a second cut at 180 degrees from the first cut aligned in a direction through the center of piezoelectric element. In another approach, forming the number of slots in the piezoelectric element from the first surface towards the second surface can include making cuts such that each cut can be arranged with respect an adjacent one of the cuts on the first surface at an angle different from 90 degrees relative to the periphery of the piezoelectric element. With angles different from 90 degrees, the cuts can be made such that none of the cuts are made in alignment to a direction through a center of the first surface of the piezoelectric element.

The depth of the slots from the first surface to the second surface can be selected relative to the thickness of the piezoelectric element as determined before making the cuts. Forming each slot can include forming each slot to extend from the first surface towards the second surface to a depth that can be greater than 50% of the thickness of the piezoelectric element relative to the thickness of the piezoelectric element prior to forming the slots. The slots can be formed to a depth that can be equal to or greater than 75% of the thickness of the piezoelectric element. Other depths can include depths equal to or greater than 85% or depths equal to or greater than 95%. The selected depths may depend on the applications to which the piezoelectric element can be used.

For operation as a sensor, the piezoelectric element can be coupled with electrically conductive leads to provide a signal across the piezoelectric element from the first surface to the second surface. The signal can be provided as a pulse, a series of pulses, or as any format that can be used to make acoustic related measurements. The electrically conductive leads can provide a signal from the piezoelectric element generated by the piezoelectric element in response to an appropriate stimulus. A number of electrically conductive leads can be connected to electrodes on the first and second surfaces of the piezoelectric element. In an embodiment, a single electrode can be formed on the first surface and conductive electrode rings can be formed on the second surface.

The piezoelectric element can be disposed as a transducer in an appropriate housing depending on the application to which the transducer can be used. The piezoelectric element can be arranged as a focused transducer in a housing, where the housing is compatible with operation at temperatures and pressures associated with drilling in a borehole. In mating the piezoelectric element to an appropriate housing, the construction process can include bonding the first surface of the piezoelectric element to a backing material. The backing material can be bonded to the housing. The piezoelectric element can be realized as a piezoelectric ceramic.

Figure 6:
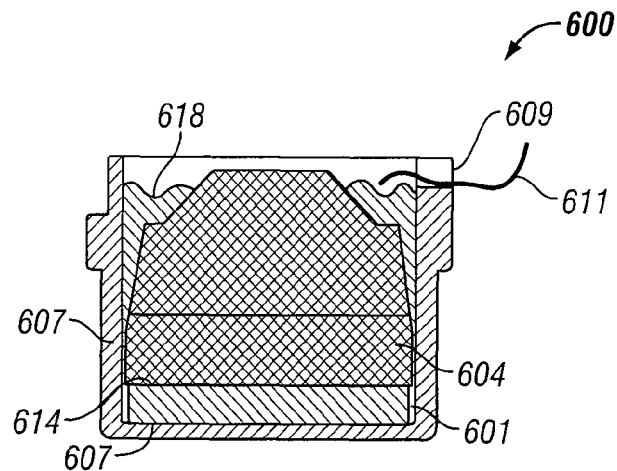
FIG. 6 shows an example transducer assembly including a piezoelectric element having slots to remove extraneous vibration modes, in accordance with various embodiments.

FIG. 6 shows an embodiment of an example apparatus 600 having a piezoelectric element 601 disposed in a housing 607. Piezoelectric element 601 has a first surface and a second surface opposite the first surface, where the piezoelectric element can be structured to operate in a thickness mode with one of the first surface or the second surface having a modification relative to the other surface such that radial modes of the piezoelectric element are reduced in operation of the piezoelectric element 601 as part of a transducer. The first surface of piezoelectric element 601 can be arranged as a front surface 615 to couple in the transducer as a sensing element and the second surface can be arranged as a back surface 614 that couples to a backing material 604. Backing material 604 can be bonded to back surface 614 and backing material 614 can be bonded to housing 607 to provide stability for piezoelectric element 601. Piezoelectric element 601 can be realized similar or identical to piezoelectric elements associated FIGS. 1-5.

Back surface 614 can include modifications to reduce radial modes of the piezoelectric element in operation of the piezoelectric element as part of a transducer. The modifications can include a number of slots disposed in piezoelectric element 601 from back surface 614 towards front surface 615 such that the slots do not reach front surface 615. The number of slots in piezoelectric element 601 from back surface 614 towards front surface 615 can include four slots in piezoelectric element 601 such that each slot can be arranged at 90 degrees from an adjacent one of the slots on back surface 614 relative to the periphery of the piezoelectric element. The number of slots in piezoelectric element 601 from back surface 614 towards front surface 615 can include a first slot in piezoelectric element 601 and a second slot at 180 degrees from the first slot aligned to a direction through the center of piezoelectric element 601. In another configuration, the number of slots in piezoelectric element 601 from back surface 614 towards front surface 615 can include slots in piezoelectric element 601 such that at least one slot can be arranged with respect to adjacent slots on back surface 614 at an angle different from 90 degrees relative to the periphery of piezoelectric element 601. The slots can be arranged such that at least one of the slots is not arranged aligned to a direction through a center of back surface 614 of piezoelectric element 601. The slots can be arranged such that none of the slots are arranged in a direction through a center of back surface 614 of piezoelectric element 601.

The depth of the slots from back surface 614 to front surface 615 can be selected relative to the thickness of piezoelectric element 601 as determined before making the slots. Each slot can extend from back surface 614 towards front surface 615 to a depth that can be greater than 50% of the thickness of piezoelectric element 601. The slots can be set to a depth that can be equal to or greater than 75% of the thickness of the piezoelectric element. Other depths can include depths equal to or greater than 85% or depths equal to or greater than 95%. The selected depths may depend on the applications to which piezoelectric element 601 may be used.

Housing 607 provides a protective housing for operation of piezoelectric element arranged as a sensor. Backing material 604, bonded to piezoelectric element 601, can be bonded to housing 607 with epoxy 618. Backing material 604 can be bonded to housing 607 without bonding piezoelectric element 601 to housing 607. Apparatus 600 can be constructed such that a single electrode can be used on back surface 614 and conductive electrode rings are disposed on front surface 615. Electrical conductors 611 can be provided through openings 609 in housing 607 to couple to the electrodes on piezoelectric element 601. Piezoelectric element 601 can be realized as a piezoelectric ceramic. Piezoelectric element can also be arranged as a focused transducer in housing 607, where housing 607 can be constructed to be compatible with operation at temperatures and pressures associated with drilling in a borehole.

Figure 7:
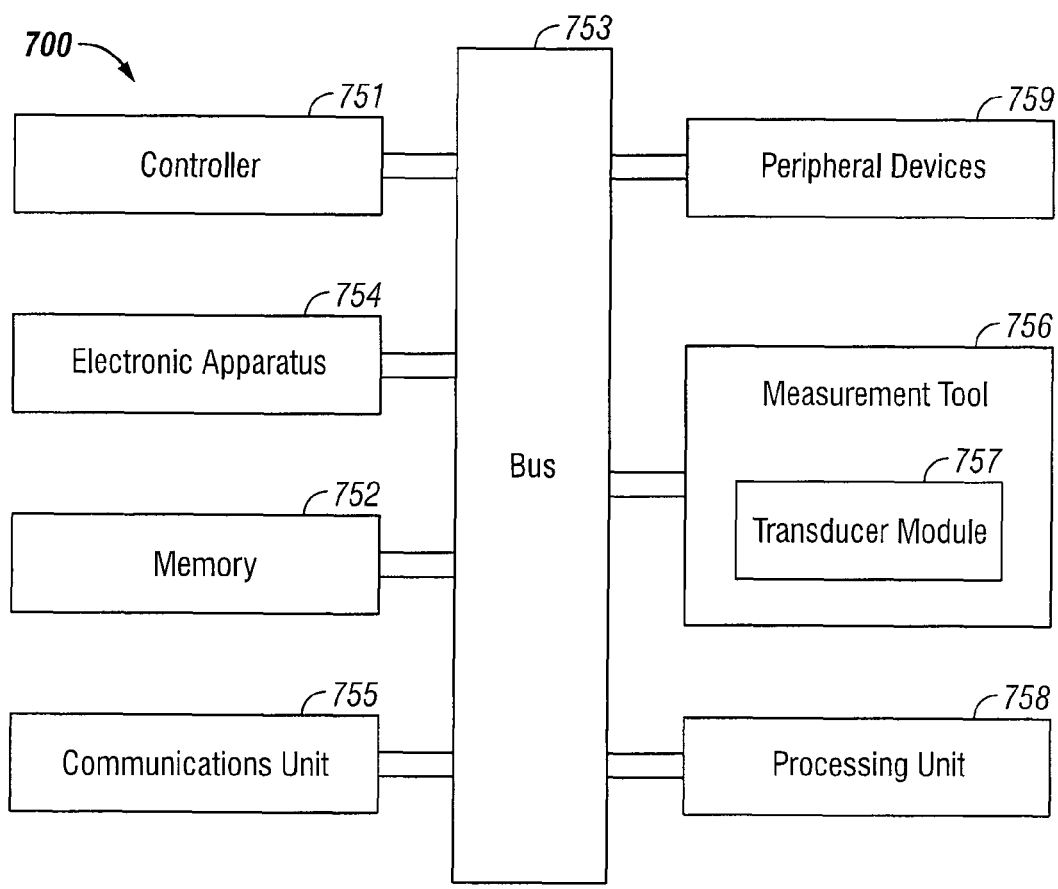
FIG. 7 depicts a block diagram of features of an example system having a tool including a transducer module, in accordance with various embodiments.

FIG. 7 depicts a block diagram of features of an example embodiment of a system 700 having a measurement tool 756 including a transducer module 757 for measurements downhole in a well. Transducer module 757 can be structured with a configuration such that the sensor of transducer module 757 is a piezoelectric element having two opposing surfaces configured such that one of the surfaces has a modification relative to the other surface such that radial modes of the piezoelectric element are reduced in operation of the piezoelectric element as part of transducer module 757. The piezoelectric element can be structured to operate in a thickness mode. Transducer module 757 can be realized as a focused ultrasonic transducer module. Transducer module 757 can be structured similar to or identical to a configuration associated with any of FIGS. 1-6.

System 700 can include a controller 751, a memory 752, an electronic apparatus 754, and a communications unit 755. Controller 751, memory 752, and communications unit 755 can be arranged to operate as a processing unit to control management of measurement tool 756 and to perform operations on data signals collected by measurement tool 756. A data processing unit can be distributed among the components of system 700 including electronic apparatus 754. Alternatively, system 700 can include a processing unit 758 to mange measurement tool 756.

Communications unit 755 can include downhole communications for communication to the surface at a well from measurement tool 756. Such downhole communications can include a telemetry system. Communications unit 755 may use combinations of wired communication technologies and wireless technologies at frequencies that do not interfere with on-going measurements.

System 700 can also include a bus 753, where bus 753 provides electrical conductivity among the components of system 700. Bus 753 can include an address bus, a data bus, and a control bus, each independently configured. Bus 753 can be realized using a number of different communication mediums that allows for the distribution of components of system 700. Use of bus 753 can be regulated by controller 751.

In various embodiments, peripheral devices 759 can include displays, additional storage memory, and/or other control devices that may operate in conjunction with controller 751 and/or memory 752. In an embodiment, controller 751 can be realized as a processor or a group of processors that may operate independently depending on an assigned function. Peripheral devices 759 can be arranged with a display, as a distributed component on the surface, that can be used with instructions stored in memory 752 to implement a user interface to manage the operation of measurement tool 756 and/or components distributed within system 700. Such a user interface can be operated in conjunction with communications unit 755 and bus 753.

Figure 8:
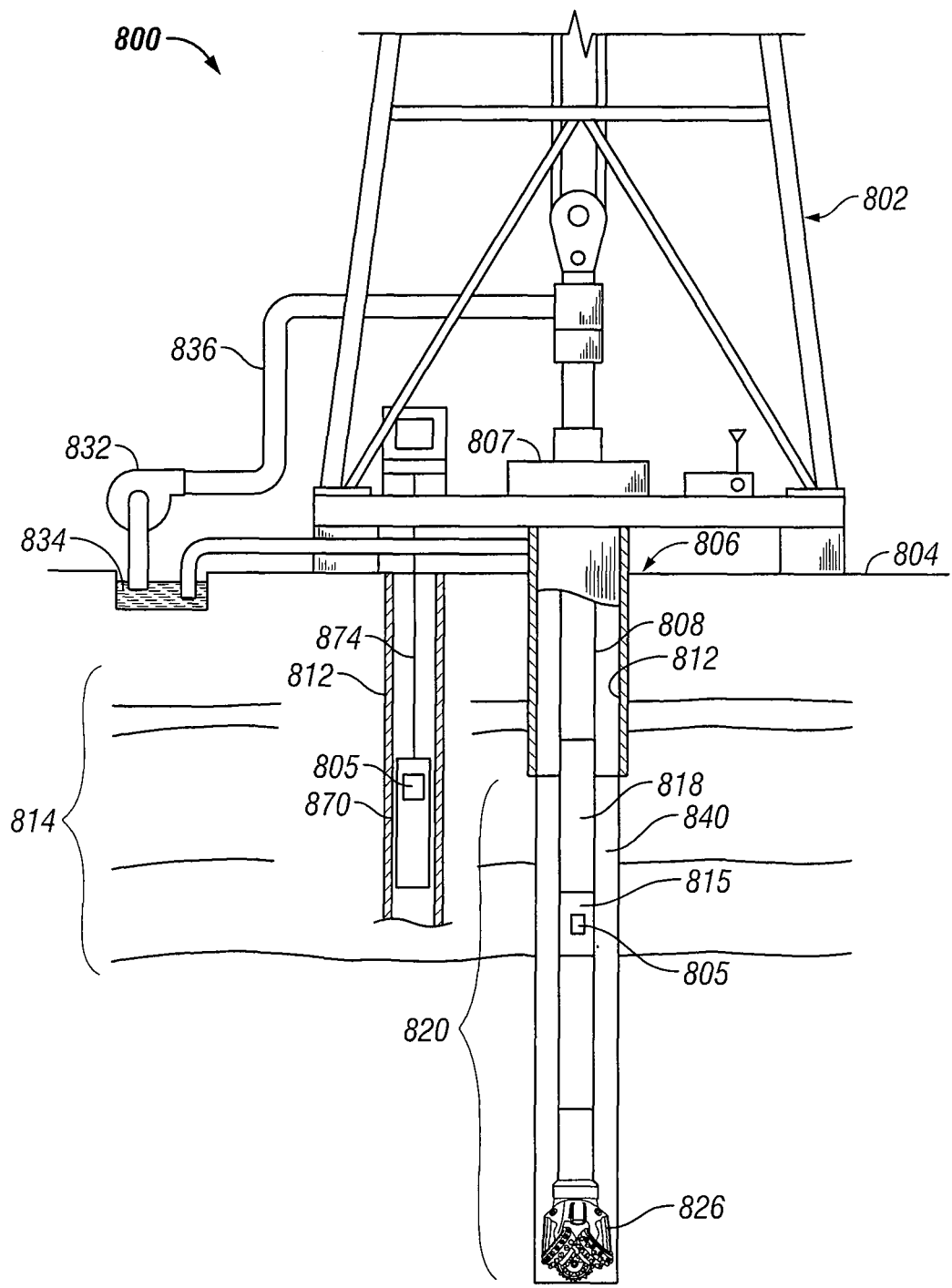
FIG. 8 depicts an example system at a drilling site, where the system includes a measurement tool having a transducer module, in accordance with various embodiments.

FIG. 8 depicts an embodiment of a system 800 at a drilling site, where system 800 includes a measurement tool 805 including a transducer module for measurements downhole in a well. The transducer module can be structured with a configuration such that the sensor of the transducer module is a piezoelectric element having two opposing surfaces configured such that one of the surfaces has a modification relative to the other surface such that radial modes of the piezoelectric element are reduced in operation of the piezoelectric element as part of the transducer module. The piezoelectric element can be structured to operate in a thickness mode. The transducer module can be realized as a focused ultrasonic transducer module. The transducer module can be structured similar to or identical to a configuration associated with any of FIGS. 1-7, in accordance with the teachings of various embodiments taught herein.

System 800 can include a drilling rig 802 located at a surface 804 of a well 806 and a string of drill pipes, that is, drill string 808, connected together so as to form a drilling string that is lowered through a rotary table 807 into a wellbore or borehole 812. The drilling rig 802 can provide support for drill string 808. The drill string 808 can operate to penetrate rotary table 807 for drilling a borehole 812 through subsurface formations 814. The drill string 808 can include drill pipe 818 and a bottom hole assembly 820 located at the lower portion of the drill pipe 818.

The bottom hole assembly 820 can include drill collar 815, measurement tool 805 attached to drill collar 815, and a drill bit 826. The drill bit 826 can operate to create a borehole 812 by penetrating the surface 804 and subsurface formations 814. Measurement tool 805 can be structured for an implementation in the borehole of a well as a MWD system such as a LWD system. The housing containing measurement tool 805 can include electronics to manage measurement tool 805 and collect responses from measurement tool 805. Such electronics can include a processing unit to analyze signals sensed by measurement tool 805 and provide measurement results to the surface over a standard communication mechanism for operating a well. Alternatively, the electronics can include a communications interface to provide signals sensed by measurement tool 805 to the surface over a standard communication mechanism for operating a well, where these sensed signals can be analyzed at a processing unit at the surface.

In various embodiments, measurement tool 805 may be included in a tool body 870 coupled to a logging cable 874 such as, for example, for wireline applications. Tool body 870 containing measurement tool 805 can include electronics to manage measurement tool 805 and collect responses from measurement tool 805. Such electronics can include a processing unit to analysis signals sensed by measurement tool 805 and provide measurement results to the surface over a standard communication mechanism for operating a well. Alternatively, the electronics can include a communications interface to provide signals sensed by measurement tool 805 to the surface over a standard communication mechanism for operating a well, where these collected sensed signals are analyzed at a processing unit at the surface. Logging cable 874 may be realized as a wireline (multiple power and communication lines), a mono-cable (a single conductor), and/or a slick-line (no conductors for power or communications), or other appropriate structure for use in bore hole 812.

During drilling operations, the drill string 808 can be rotated by the rotary table 807. In addition to, or alternatively, the bottom hole assembly 820 can also be rotated by a motor (e.g., a mud motor) that is located downhole. The drill collars 815 can be used to add weight to the drill bit 826. The drill collars 815 also can stiffen the bottom hole assembly 820 to allow the bottom hole assembly 820 to transfer the added weight to the drill bit 826, and in turn, assist the drill bit 826 in penetrating the surface 804 and subsurface formations 814.

During drilling operations, a mud pump 832 can pump drilling fluid (sometimes known by those of skill in the art as "drilling mud") from a mud pit 834 through a hose 836 into the drill pipe 818 and down to the drill bit 826. The drilling fluid can flow out from the drill bit 826 and be returned to the surface 804 through an annular area 840 between the drill pipe 818 and the sides of the borehole 812. The drilling fluid may then be returned to the mud pit 834, where such fluid is filtered. In some embodiments, the drilling fluid can be used to cool the drill bit 826, as well as to provide lubrication for the drill bit 826 during drilling operations. Additionally, the drilling fluid may be used to remove subsurface formation 814 cuttings created by operating the drill bit 826.

Although specific embodiments have been illustrated and described herein, it will be appreciated by those of ordinary skill in the art that any arrangement that is calculated to achieve the same purpose may be substituted for the specific embodiments shown. Various embodiments use permutations and/or combinations of embodiments described herein. It is to be understood that the above description is intended to be illustrative, and not restrictive, and that the phraseology or terminology employed herein is for the purpose of description. Combinations of the above embodiments and other embodiments will be apparent to those of skill in the art upon studying the above description.

What is claimed is:

1. A method comprising:
   providing a piezoelectric element, having a first surface and a second surface opposite the first surface;
   modifying one of the first surface or the second surface such that radial modes of the piezoelectric element are reduced in operation of the piezoelectric element in a transducer such that the first surface or the second surface opposite the modified one is arranged as a sensing element.

2. A method comprising:
   providing a piezoelectric element, having a first surface and a second surface opposite the first surface;
   modifying one of the first surface or the second surface such that radial modes of the piezoelectric element are reduced in operation of the piezoelectric element in a transducer, modifying one of the first surface or the second surface includes forming a number of slots in the piezoelectric element from the first surface towards the second surface such that the slots do not reach the second surface; and
   making cuts in the piezoelectric element such that at least one slot of the number of slots is arranged at a non-zero angle from another slot of the number of slots on the first surface relative to the periphery of the piezoelectric element.

3. The method of claim 2, wherein forming the number of slots in the piezoelectric element from the first surface towards the second surface includes making four cuts in the piezoelectric element such that each cut is arranged at 90 degrees from an adjacent one of the cuts on the first surface relative to the periphery of the piezoelectric element.

4. The method of claim 2, wherein forming the number of slots in the piezoelectric element from the first surface towards the second surface includes making a first cut in the piezoelectric element and making a second cut at 180 degrees from the first cut aligned in a direction through the center of the piezoelectric element.

5. The method of claim 2, wherein forming the number of slots in the piezoelectric element from the first surface towards the second surface includes making cuts such that each cut is arranged with respect an adjacent one of the cuts on the first surface at an angle different from 90 degrees relative to the periphery of the piezoelectric element.

6. The method of claim 5, wherein none of the cuts are made in alignment to a direction through a center of the first surface of the piezoelectric element.

7. The method of claim 2, wherein forming each slot includes forming each slot to extend from the first surface towards the second surface to a depth that is greater than 50% of a thickness of the piezoelectric element relative to the thickness of the piezoelectric element prior to forming the slots.

8. A method comprising:
   providing a piezoelectric element, having a first surface and a second surface opposite the first surface:
   modifying one of the first surface or the second surface such that radial modes of the piezoelectric element are reduced in operation of the piezoelectric element in a transducer; and forming a single electrode on the first surface and conductive electrode rings on the second surface.

9. The method of claim 8, wherein the method includes bonding the first surface to a backing material.

10. The method of claim 8, wherein the method includes arranging the piezoelectric element as a thcused transducer in a housing compatible with operation at temperatures and pressures associated with drilling in a borehole.

11. The method of claim 8, wherein the piezoelectric element includes a piezoelectric ceramic.

12. An apparatus comprising:
    a piezoelectric element operable as part of a transducer, the piezoelectric element having a first surface and a second surface opposite the first surface, the piezoelectric element structured to operate in a thickness mode with one of the first surface or the second surface having a modification relative to the other surface such that radial modes of the piezoelectric element are reduced in operation of the piezoelectric element in the transducer such that the first surface or the second surface opposite the modified one is arranged as a sensing element.

13. An apparatus comprising:
    a piezoelectric element operable as part of a transducer, the piezoelectric element having a first surface and a second surface opposite the first surface, the piezoelectric element structured to operate in a thickness mode with one of the first surface or the second surface having a modification relative to the other surface such that radial modes of the piezoelectric element are reduce operation of the piezoelectric e ement in the transducer, wherein the modification includes a number of slots disposed in the piezoelectric element from the first surface towards the second surface such that the slots do not reach the second surface, at least one slot of the number of slots arranged at a non-zero angle from another slot of the number of slots on the first surface relative to the periphery of the piezoelectric element.

14. The apparatus of claim 13, wherein the number of slots in the piezoelectric element from the first surface towards the second surface includes four slots in the piezoelectric element such that each slot is arranged at 90 degrees from an adjacent one of the slots on the first surface relative to the periphery of the piezoelectric element.

15. The apparatus of claim 13, wherein the number of slots in the piezoelectric element from the first surface towards the second surface includes a first slot in the piezoelectric element and a second slot at 180 degrees from the first slot aligned to a direction through the center of the piezoelectric element.

16. The apparatus of claim 13, wherein the number of slots in the piezoelectric element from the first surface towards the second surface includes slots in the piezoelectric element such that at least one slot is arranged with respect to adjacent slots on the first surface at an angle different from 90 degrees relative to the periphery of the piezoelectric element.

17. The apparatus of claim 16, wherein at least one of the slots is not arranged aligned to a direction through a center of the first surface of the piezoelectric element.

18. The apparatus of claim 13, wherein each slot extends from the first surface towards the second surface to a depth that is greater than 50% of a thickness of the piezoelectric element relative to the thickness of the piezoelectric element in portions of the piezoelectric element without slots.

19. An apparatus comprising:
    a piezoelectric element operable as part of a transducer, the piezoelectric element having a first surface and a second surface opposite the first surface, the piezoelectric element structured to operate in a thickness mode with one of the first surface or the second surface having a modification relative to the other surface such that radial modes of the piezoelectric element are reduced in operation of the piezoelectric element in the transducer, the modification including a number of slots disposed in the piezoelectric element from the first surface towards the second surface such that the slots do not reach the second surface a single electrode on the first surface and conductive electrode rings on the second surface; and a single electrode on the first surface and conductive electrode rings on the second surface.

20. The apparatus of claim 19, wherein the apparatus includes the first surface bonded to a backing material.

21. The apparatus of claim 19, wherein the piezoelectric element is arranged as a focused transducer in a housing, the housing compatible with operation at temperatures and pressures associated with drilling in a borehole.

22. The apparatus of claim 19, wherein the piezoelectric ement includes a piezoelectric ceramic.

\* \* \* \* \*